United States Patent [19]
Gardner et al.

[11] Patent Number: 5,654,215
[45] Date of Patent: Aug. 5, 1997

[54] METHOD FOR FABRICATION OF A NON-SYMMETRICAL TRANSISTOR

[75] Inventors: Mark I. Gardner, Cedar Creek; Daniel Kadosh; Robert Dawson, both of Austin, all of Tex.

[73] Assignee: Advanced Micro Devices, Inc., Austin, Tex.

[21] Appl. No.: 713,388

[22] Filed: Sep. 13, 1996

[51] Int. Cl.$^6$ ............................................... H01L 21/8234
[52] U.S. Cl. ........................ 438/286; 438/305; 438/911
[58] Field of Search ........................ 437/40 AS, 41 AS, 437/405 W, 415 W, 44

[56] References Cited

U.S. PATENT DOCUMENTS

| | | | |
|---|---|---|---|
| 5,171,700 | 12/1992 | Zamanian | 437/44 |
| 5,286,664 | 2/1994 | Horiuchi | 437/44 |
| 5,424,229 | 6/1995 | Oyamatsu | 437/35 |
| 5,424,234 | 6/1995 | Kwon | 437/44 |
| 5,518,940 | 5/1996 | Hodate et al. | 437/44 |
| 5,585,293 | 12/1996 | Sharma et al. | 437/44 |

FOREIGN PATENT DOCUMENTS

| | | | |
|---|---|---|---|
| 2280342 | 11/1990 | Japan | 437/44 |
| 2292833 | 12/1990 | Japan | 437/44 |
| 3171740 | 7/1991 | Japan | 437/44 |
| 5267327 | 10/1993 | Japan | 437/44 |

Primary Examiner—Chandra Chaudhari
Assistant Examiner—Toniae M. Thomas
Attorney, Agent, or Firm—Skjerven, Morrill, MacPherson, Franklin & Friel; David M. Sigmond; M. Kathryn Tsirigotis

[57] ABSTRACT

In the present invention, a method for fabrication of a non-symmetrical LDD-IGFET is described. In one embodiment, a gate insulator and a gate electrode, such as a polysilicon, are formed over a semiconductor substrate, the gate electrode having a top surface and opposing first and second sidewalls. A first dopant is implanted into the semiconductor substrate to provide a lightly doped drain region substantially aligned with the second sidewall. First and second symmetrical spacers are then formed adjacent the first and second sidewalls, respectively. A second dopant is implanted into the semiconductor substrate after forming the symmetrical spacers to provide a moderately-lightly doped drain region substantially aligned with the outer region of the second symmetrical spacer. After implanting the second dopant, first and second non-symmetrical spacers are formed adjacent the first and second sidewalls, respectively. A heavy dose of a third dopant is then implanted into the semiconductor substrate to provide a heavily doped source region and a heavily doped drain region. In another embodiment, a fourth dopant is implanted into the semiconductor substrate before forming the first and second symmetrical spacers further doping the lightly doped drain region.

34 Claims, 6 Drawing Sheets

METHOD FOR FABRICATION OF A NON-SYMMETRICAL TRANSISTOR

BACKGROUND OF THE INVENTION

U.S. patent application Ser. No. 08/713,386 entitled "Method For Fabrication Of A Non-Symmetrical Transistor", (Gardner, et al) is filed concurrently herewith and incorporated by reference.

1. Field of the Invention

The present invention relates to integrated circuits, and more particularly to lightly doped drain insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate as a mask. This self-aligning procedure tends to improve packing density and reduce parasitic overlap capacitances between the gate electrode and the source/drain regions. Heavily doped polysilicon (also called polycrystalline silicon, poly-Si or poly) thin films are used as the gate electrode. Since polysilicon has the same high melting point as a silicon substrate, it can be deposited prior to source and drain formation. The polysilicon is anisotropically etched through openings in a photoresist mask to provide a gate electrode which provides a mask during formation of the source and drain by ion implantation. Photolithography is used to create patterns in the photoresist mask that define the gate electrode.

A number of techniques have been utilized to reduce hot carrier effects. The voltages applied to the device can be decreased or appropriate drain engineering design techniques, which result in special drain structures that reduce hot electron effects, can be implemented. One such technique is a lightly doped drain (LDD). LDDs distribute some of the potential into the drain and thus reduce the maximum electric field. The drain is typically formed by two ion implants. One of these is self-aligned to the gate electrode, and the other is self-aligned to the gate electrode on which sidewall spacers have been formed. The spacers are typically oxides, nitrides or oxy-nitrides. The purpose of the lighter first dose is to form a lightly doped region of the drain (or LDD) at the gate electrode sidewall near the channel, which can reduce the maximum electric field. The second heavier dose forms a low resistivity region of the drain, which is subsequently merged with the lightly doped region. Thereafter, electrical contacts are formed on the heavily doped region. Since the heavily doped region is farther away from the channel than a conventional drain structure, the depth of the heavily doped region can be made somewhat greater without adversely affecting the device characteristics. The lightly doped region is not necessary for the source, however LDD structures are typically formed for both the drain and source to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET. The saturation drain current is affected little by the parasitic resistance of the drain region and greatly by the effective gate voltage drop due to the parasitic resistance of the source region. Reduction of the drain current can, therefore, be decreased by implementation of a non-symmetrical LDD-IGFET with a lightly doped region only at the drain. However, a non-symmetrical LDD-IGFET can further increase fabrication complexity.

Another approach to improving the characteristics of the conventional LDD having an N-type dopant involves an increase in the doping of the lightly doped N-region of the drain, or a moderately-lightly doped drain (M-LDD) structure. The spacer width and the thermal budget after the N-implant are basically the same as in the conventional LDD, however, the M-LDD exhibits increased hot-carrier resistance and improved drive current.

One method for non-symmetrical LDD-MOSFET fabrication is U.S. Pat. No. 5,424,229 entitled "Method For Manufacturing MOSFET Having An LDD Structure" (Oyamatsu) which includes masking the substrate before the gate electrode is formed and leaving a window open in the mask. The lightly doped drain region is then implanted at an angle into the substrate through the window opening. The mask is removed and the gate electrode is formed in the window opening and over a portion of the lightly doped drain region. The heavily doped regions are then formed aligned with the sidewalls of the gate electrode. However, implanting doped regions at an angle into the substrate increases fabrication complexity.

Another method is U.S. Pat. No. 5,286,664 entitled "Method For Fabricating The LDD-MOSFET" (Horiuchi) wherein the gate electrode is formed and then one half of the gate electrode (on the source side) is masked with a photoresist mask. The lightly doped drain region is implanted. Then a single spacer is formed on the drain side using a liquid phase deposition (LPD) method for depositing silicon dioxide. The mask is then removed and the heavily doped regions are implanted. The LPD method however is not precise and can make controlling the thickness or size of the spacer difficult.

Accordingly, there is a need for a non-symmetrical LDD-IGFET which decreases the parasitic resistance, therefore increasing drain current, which can be precisely fabricated.

SUMMARY OF THE INVENTION

In the present invention, a method for fabrication of a non-symmetrical LDD-IGFET is described. In one embodiment, a gate insulator and a gate electrode, such as a polysilicon, are formed over a semiconductor substrate, the gate electrode having a top surface and opposing first and second sidewalls. A first dopant is implanted into the semiconductor substrate to provide a lightly doped drain region substantially aligned with the second sidewall. First and second symmetrical spacers are then formed adjacent the first and second sidewalls, respectively. A second dopant is implanted into the semiconductor substrate after forming the symmetrical spacers to provide a moderately-lightly doped drain region substantially aligned with the outer region of the second symmetrical spacer. After implanting the second dopant, first and second non-symmetrical spacers are formed adjacent the first and second sidewalls, respectively. A heavy dose of a third dopant is then implanted into the semiconductor substrate to provide a heavily doped source region and a heavily doped drain region.

In another embodiment, a fourth dopant is implanted into the semiconductor substrate before forming the first and second symmetrical spacers further doping the lightly doped drain region.

The present fabrication method of a non-symmetrical LDD IGFET provides the advantages described for non-symmetrical LDD IGFETs of enhanced speed performance and drive current while maintaining reliability. These and other features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
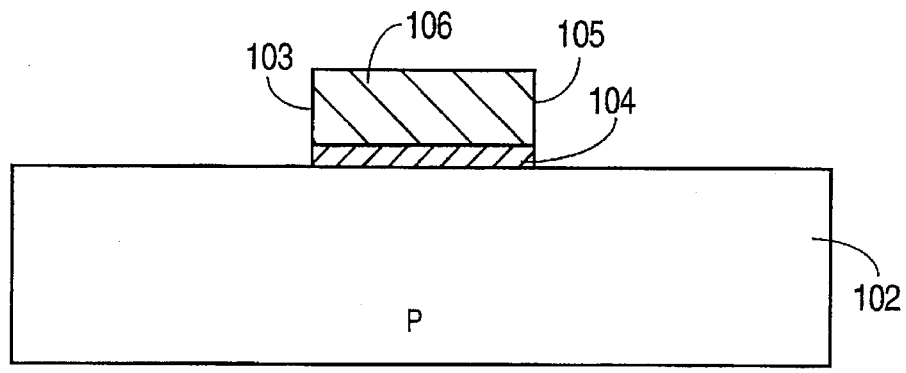
FIGS. 1A–1I show cross-sectional views of successive process steps for formation of an IGFET in accordance with a first embodiment of the invention.

In the drawings, depicted elements are not necessarily drawn to scale and like or similar elements may be designated by the same reference numeral throughout the several views.

FIGS. 1A–1I show cross-sectional views of successive process steps for formation of a non-symmetrical LDD IGFET in accordance with a first embodiment of the invention. In FIG. 1A, a gate electrode such as polysilicon 106 is disposed on a gate oxide 104, which in turn is disposed on a semiconductor substrate 102 suitable for integrated circuit manufacture. For instance, substrate 102 includes a P-type planar epitaxial surface layer with a <100> orientation and a resistivity of 12 ohm-cm. Preferably, the epitaxial surface layer is disposed on a P+ base layer (not shown). A blanket layer of gate oxide 104 (such as $SiO_2$) is formed on the top surface of substrate 102 using tube growth at a temperature of 700° to 1,000° C. in an $O_2$ containing ambient. Gate oxide 104 has a thickness in the range of 30 to 200 angstroms.

Thereafter, a blanket layer of polysilicon 106 is deposited by low pressure chemical vapor deposition (LPCVD) on the top surface of gate oxide 104. Polysilicon 106 has a thickness in the range of 250 to 4,000 angstroms. Polysilicon 106 is deposited undoped. Thereafter, polysilicon 106 and gate oxide 104 are patterned using photolithography and an anisotropic dry etch. For submicron dimensions, patterning a photoresist mask (not shown) by I-line photolithography using a mercury vapor lamp is preferred. After the photoresist mask is patterned and an anisotropic etch is applied, polysilicon 106 is etched back to provide a gate electrode and gate oxide 104 is used as an etch stop and a gate insulator. Preferably, a first etchant is applied that is highly selective of polysilicon, then a second etchant is applied that is highly selective of oxides. After etching occurs, polysilicon 106 includes substantially vertical opposing first and second sidewalls 103 and 105, respectively. The gate oxide 104 is substantially aligned with the first and second sidewalls 103 and 105. The gate oxide 104 on the substrate 102 outside the polysilicon 106 is removed or may be left in place (not shown) for subsequent processing.

Figure 1B:
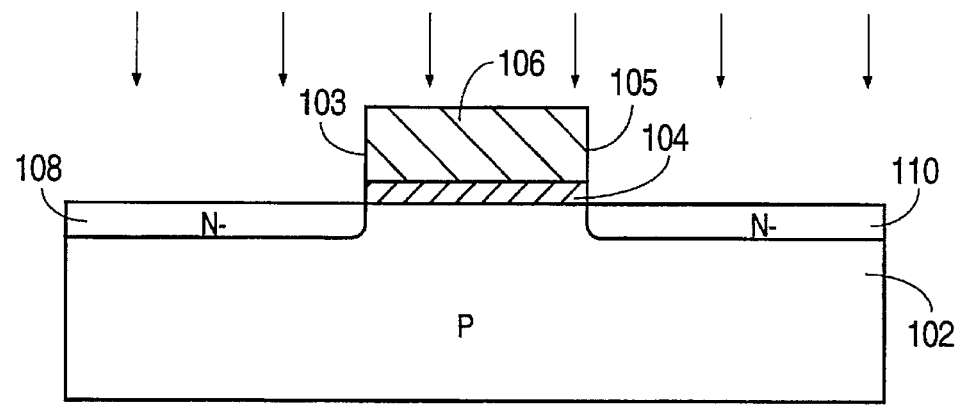

In FIG. 1B, a light dose of a first dopant is implanted into the semiconductor substrate 102 to provide a lightly doped source region 108 and a lightly doped drain region 110. The first dopant is also implanted into the undoped polysilicon 106 wherein the polysilicon 106 is lightly doped. For instance, the structure is subjected to ion implantation of phosphorus at a dose in the range of $5 \times 10^{13}$ to $1 \times 10^{14}$ atoms/cm$^2$ and an energy in the range of 2 to 80 kiloelectron-volts. As a result, the lightly doped source region 108, substantially aligned with the first sidewall 103, and the lightly doped drain region 110, substantially aligned with the second sidewall 105, are formed at and below the surface of substrate 102. Lightly doped source and drain regions 108 and 110, respectively, are doped N− with a dopant concentration in the range of about $5 \times 10^{17}$ to $5 \times 10^{18}$ atoms/cm$^3$, and a junction depth in the range of 0.01 to 0.15 microns.

Figure 1C:
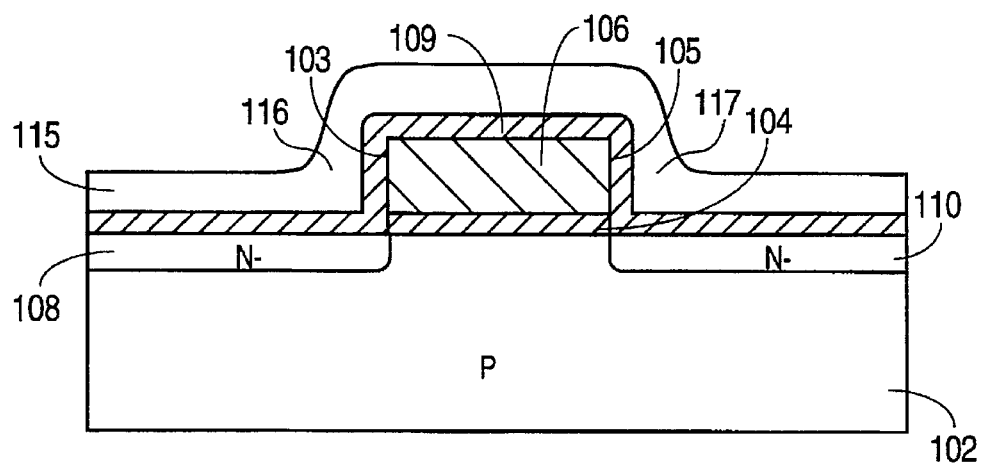

In FIG. 1C an oxide layer 109 (such as $SiO_2$) is formed on the whole surface of the resultant structure using tube growth at a temperature of 700° to 1,000° C. in an $O_2$ containing ambient and has a thickness in the range of 100 to 500 angstroms. A nitride layer 115, such as silicon oxy-nitride or silicon containing nitride, is then deposited on the surface of the oxide layer 109. The nitride layer 115 can be deposited by plasma deposition at a temperature in the range of 150° to 500° C. or by LPCVD at a temperature in the range of 600° to 900° C.

The nitride layer 115 and oxide layer 109 together provide a first symmetrical spacer 116 adjacent the first sidewall 103 and a second symmetrical spacer 117 adjacent the second sidewall 105, the first and second symmetrical spacers 116 and 117, respectively, having essentially identical sizes. The oxide layer 109 extends a lateral distance in the range of 100 to 500 angstroms from the first and second sidewalls 103 and 105, respectively. The nitride layer 115 has a thickness in the range of 200 to 2000 angstroms. Therefore, the first and second symmetrical spacers 116 and 117, respectively, extend a lateral distance in the range of 300 to 2500 angstroms from the first and second sidewalls 103 and 105, respectively. The outer region of each of the first and second symmetrical spacers 116 and 117, respectively, is the boundary between each of the first and second symmetrical spacers 116 and 117, respectively, and a thinner portion of the oxide layer 109 which fails to provide an implant mask.

Figure 1D:
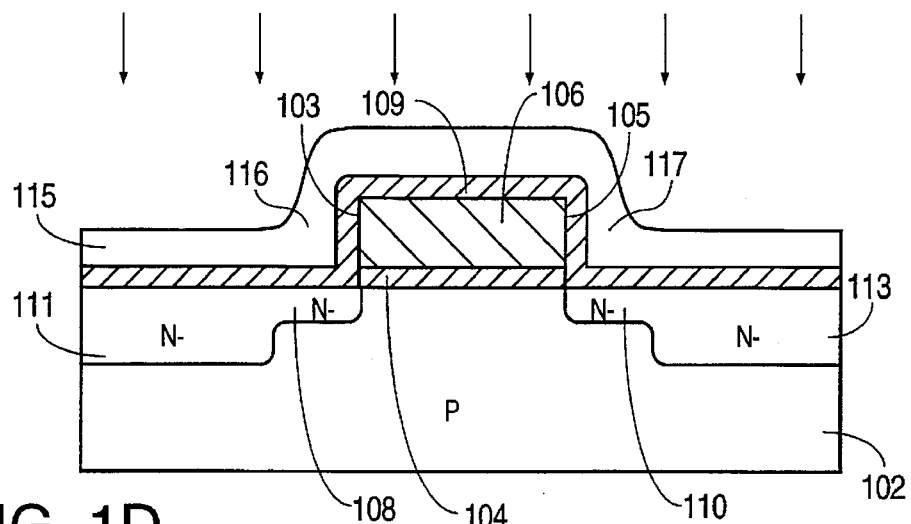

In FIG. 1D, a second dopant is implanted into the semiconductor substrate 102 and the polysilicon 106 using the polysilicon 106 and the first and second symmetrical spacers 116 and 117 as implant masks for the semiconductor substrate 102. Implanting the second dopant provides a moderately-lightly doped source region 111 and a moderately-lightly doped drain region 113 and provides a higher dopant concentration in the polysilicon 106. Preferably, the structure is subjected to ion implantation of arsenic at a dose in the range of $1 \times 10^{15}$ to $2 \times 10^{15}$ atoms/cm$^2$ and an energy in the range of 2 to 80 kiloelectron-volts, wherein the minimum implant energy is consistent with the sum of the thickness of the oxide layer 109 and the nitride layer 115. As a result, the moderately-lightly doped source region 111, substantially aligned with the outer region first symmetrical spacer 116, and the moderately-lightly doped drain region 113, substantially aligned with the outer region of the second symmetrical spacer 117 are formed at and below the surface of substrate 102. Moderately-lightly doped source and drain regions 111 and 113, respectively, are doped N− with a dopant concentration in the range of about $5\times10^{17}$ to $1\times10^{19}$ atoms/cm$^3$, and a junction depth in the range of 0.01 to 0.15 microns.

Figure 1E:
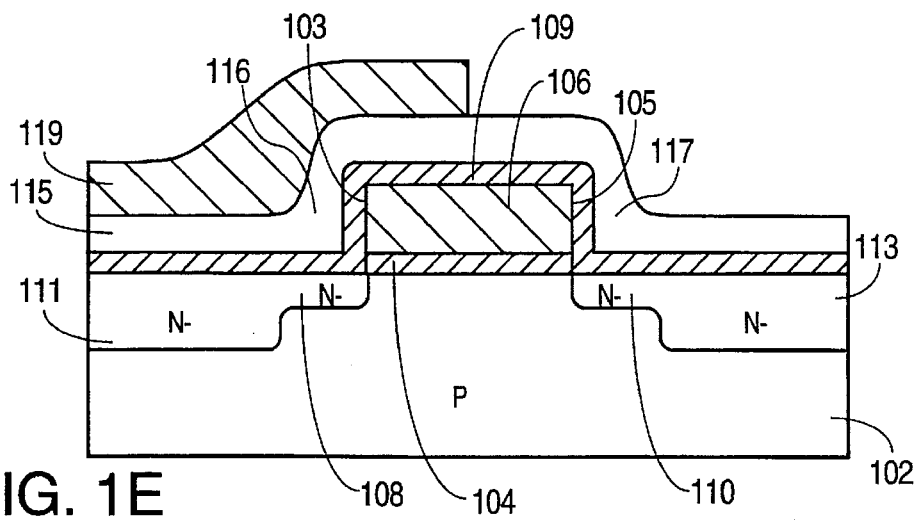

In FIG. 1E, a masking fill 119, such as a photoresist fill, is formed on the nitride layer 115 above the first sidewall 103, the masking fill 119 having an opening which exposes the nitride layer over a portion of the top surface of the polysilicon 106, the second sidewall 105 and the semiconductor substrate 102 outside of the second sidewall 105.

Figure 1F:
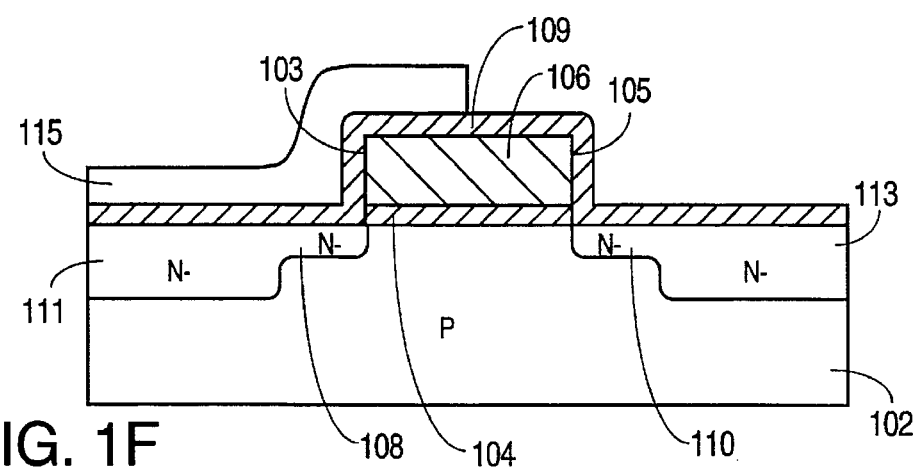

As shown in FIG. 1F, the nitride layer 115 exposed through the opening in the masking fill 119 is etched with a wet or dry etch that is highly selective of nitride to provide an opening in the nitride layer 115 which exposes the oxide layer 109 over a portion of the top of the polysilicon 106, adjacent the second sidewall 105 and over the semiconductor substrate 102 outside of the second sidewall 105 and wherein the nitride layer 115 covers the oxide layer 109 adjacent the first sidewall 103. The masking fill 119 is then removed.

Figure 1G:
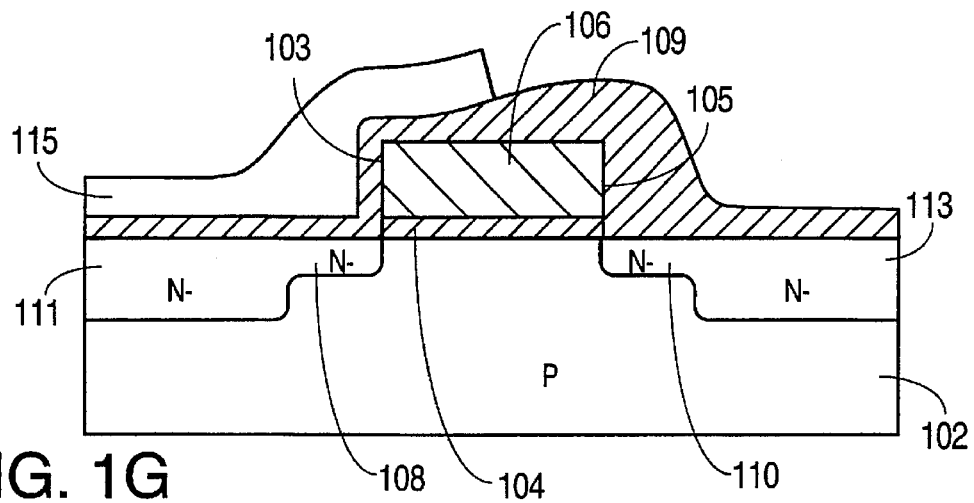

As shown, in FIG. 1G, the oxide layer 109 adjacent the first sidewall 103 is isolated by the nitride layer 115. Selective thermal oxidation is applied to the oxide layer 109 exposed through the opening in the nitride layer 115 wherein the oxide layer 109 adjacent the second sidewall 105 increases in size and the oxide layer 109 adjacent the first sidewall 103 remains substantially constant in size. For instance, the resultant structure is put into an H$_2$O or O$_2$ containing ambient and oxide is thermally grown at temperatures in the range of 800 to 1000° C. The oxide grows where there is no masking nitride layer 115. Furthermore, at the edge of the nitride layer 115, as seen in FIG. 1G, some oxidant diffuses laterally causing the oxide to grow under and lift the nitride layer 115 edge adjacent to the opening in the nitride layer 115.

In this thermal oxidation step, the oxidation growth rate of the polysilicon 106 is greater than the oxidation growth rate of the semiconductor substrate 102. Doping the polysilicon 106 with an n-type dopant, as discussed in FIGS. 1B and 1D, enhances the polysilicon oxidation. Generally, the higher the dopant concentration, the more enhanced the oxidation growth rate. In the present invention, for instance, the polysilicon 106 is doped with n-type dopants after deposition during the implant of the first dopant and again during the implant of the second dopant into the semiconductor substrate 102 (see FIG. 1B and FIG. 1D).

Figure 1H:
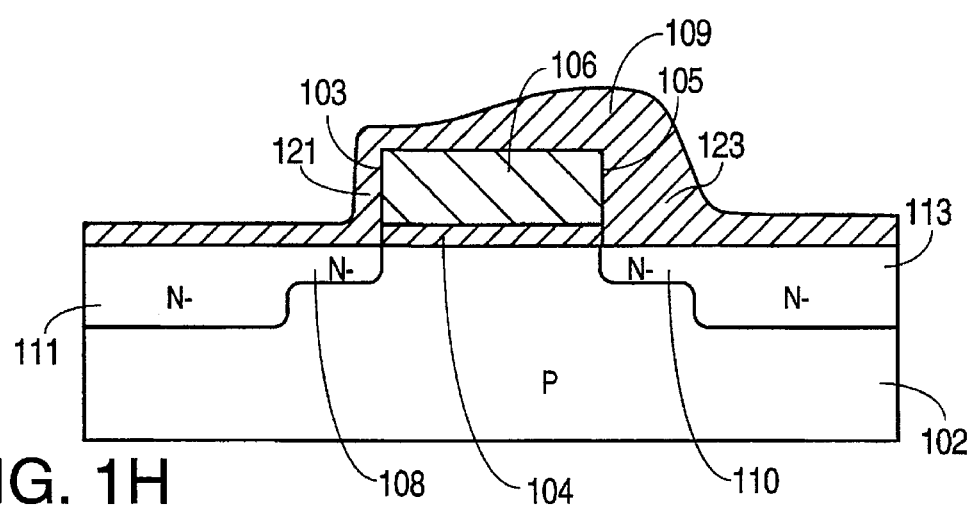

In FIG. 1H, the nitride layer 115 is removed with an etchant that is highly selective of nitride. Once the nitride layer 115 has been removed, the oxide layer 109 adjacent the first sidewall 103 provides a first non-symmetrical spacer 121 and the oxide layer 109 adjacent the second sidewall 105 provides a second non-symmetrical spacer 123 wherein the first and second non-symmetrical spacers 121 and 123, respectively, have substantially different sizes.

Figure 1I:
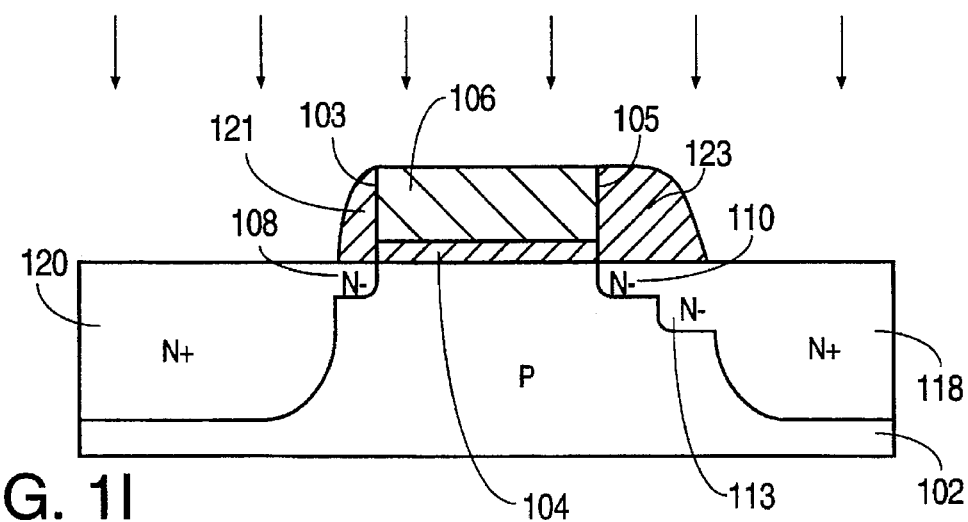

In FIG. 1I, the oxide layer 109 including the first and second non-symmetrical spacers 121 and 123, respectively is partially etched back to provide a more uniform surface on the resultant structure. Either a dry or wet chemical etch may be used. The first non-symmetrical spacer 121 may be removed entirely during the etching process (not shown) or a portion thereof may be left in place. In either case, at least a portion of the second non-symmetrical spacer 123 remains. A heavy dose of a third dopant is then implanted into the semiconductor substrate 102 to provide a heavily doped drain region 118 adjacent to and outside the second non-symmetrical spacer 123 and a heavily doped source region 120 adjacent to and outside the first non-symmetrical spacer 121. The heavily doped drain region 118 and heavily doped source region 120 are formed in the semiconductor substrate 102 using the polysilicon 106, the first non-symmetrical spacer 121 and the second non-symmetrical spacer 123 as implant masks. The implant is performed using arsenic at a dosage of $1\times10^{15}$ to $5\times10^{15}$ atoms/cm$^2$ and an energy in the range of 2 to 80 kiloelectron-volts. As a result, the heavily doped drain region 118 and heavily doped source region 120 are formed at and below the surface of the semiconductor substrate 102 and are doped N+ with a dopant concentration in the range of $1\times10^{19}$ to $5\times10^{20}$ atoms/cm$^3$, and a depth in the range of 0.02 to 0.3 microns. The heavily doped drain region 118, the moderately-lightly doped drain region 113 and the lightly doped drain region 110 together form a drain in the semiconductor substrate 102. The entire lightly doped source region 108 and moderately-lightly doped source region 111, each an N− region, are converted into an N+ region and effectively eliminated if the first non-symmetrical spacer 121 is removed before implanting the third dopant. However, if the first non-symmetrical spacer 121 or a portion thereof is left in place during the implant of the third dopant, then the moderately-lightly doped source region 111 is effectively eliminated, however, a portion of the lightly doped source region 108 remains beneath the first non-symmetrical space 121 and the resistance of the source in the semiconductor substrate 102 is higher than it would be had the entire lightly doped source region 108 been converted.

A primary difference between the second embodiment and the first embodiment is that, in the second embodiment, a fourth dopant is implanted into the semiconductor substrate and the polysilicon after implanting the first dopant and before forming the symmetrical spacers, further doping the lightly doped drain region and further enhancing the polysilicon oxidation.

Unless otherwise noted, the elements for the second embodiment (e.g., substrate 202, gate oxide 204, etc.) are similar to elements of the first embodiment (e.g., substrate 102, gate oxide 104, etc.), and the description of related elements and process steps need not be repeated.

Figure 2A:
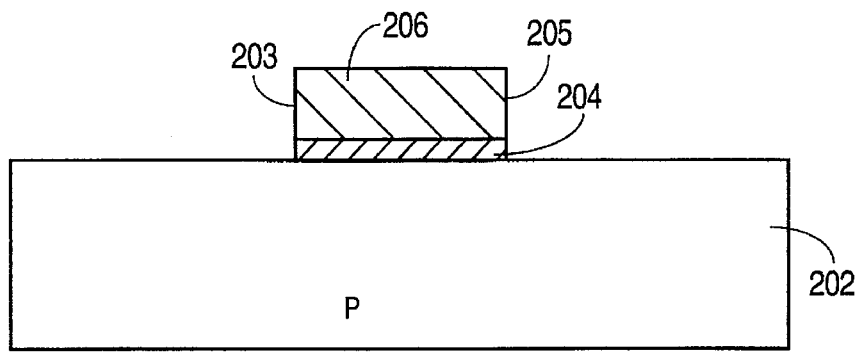
FIGS. 2A–2J show cross-sectional views of successive process steps for formation of an IGFET in accordance with a second embodiment of the invention.

FIGS. 2A–2J show cross sectional views of successive process steps for formation of a non-symmetrical LDD-IGFET in accordance with the second embodiment of the invention. In FIG. 2A, gate oxide 204 is disposed on semiconductor substrate 202, and polysilicon 206 is disposed on gate oxide 204. Polysilicon 206 is undoped and has substantially vertical opposing first and second sidewalls 203 and 205, respectively, defining a gate electrode.

Figure 2B:
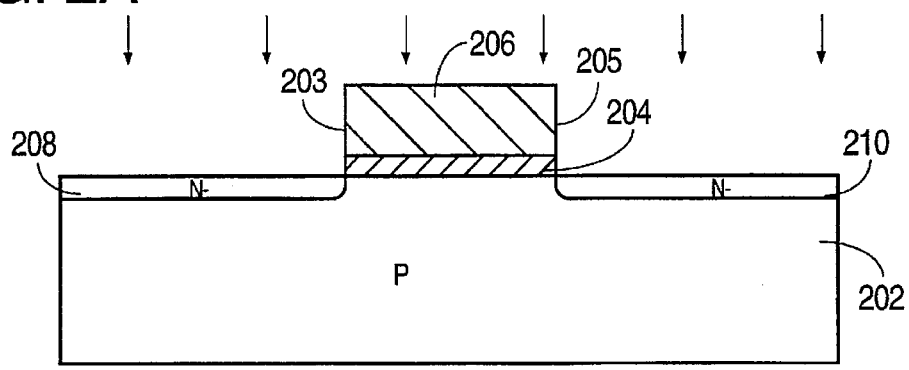
Figure 2C:
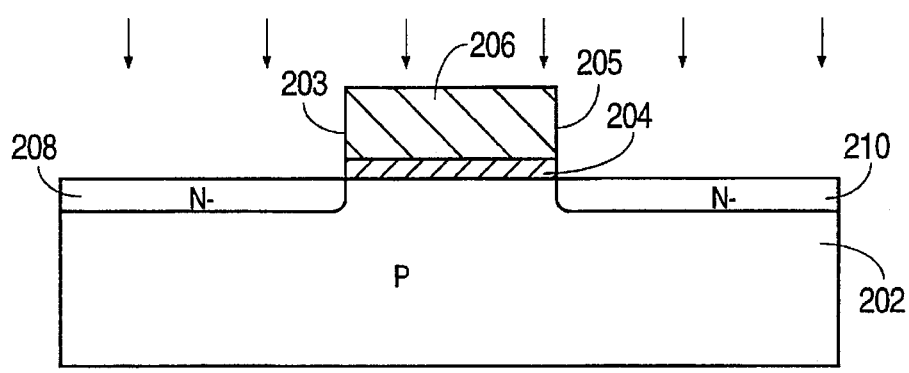

In FIG. 2B, a light dose of a first dopant, such as phosphorus, is implanted by ion implantation into the resultant structure at a dose in the range of $5\times10^{13}$ to $1\times10^{14}$ atoms/cm$^2$ and an energy in the range of 2 to 80 kiloelectron-volts. In FIG. 2C, a fourth dopant, such as arsenic, is also implanted into the resultant structure at a dose in the range of $5\times10^{14}$ to $1\times10^{15}$ atoms/cm$^2$ and an energy in the range of 2 to 80 kiloelectron-volts. As a result of implanting both the first and fourth dopants, a lightly doped source region 208, substantially aligned with the first sidewall 203, and a lightly doped drain region 210, substantially aligned with the second sidewall 205, are formed at and below the surface of substrate 202. Lightly doped source and drain regions 208 and 210, respectively, are doped N− with a dopant concentration in the range of about $5\times10^{17}$ to $1\times10^{19}$ atoms/cm$^3$, and a junction depth in the range of 0.01 to 0.15 microns. The first and fourth dopants are also implanted into the undoped polysilicon 206 to provide a lightly doped polysilicon 206.

Figure 2D:
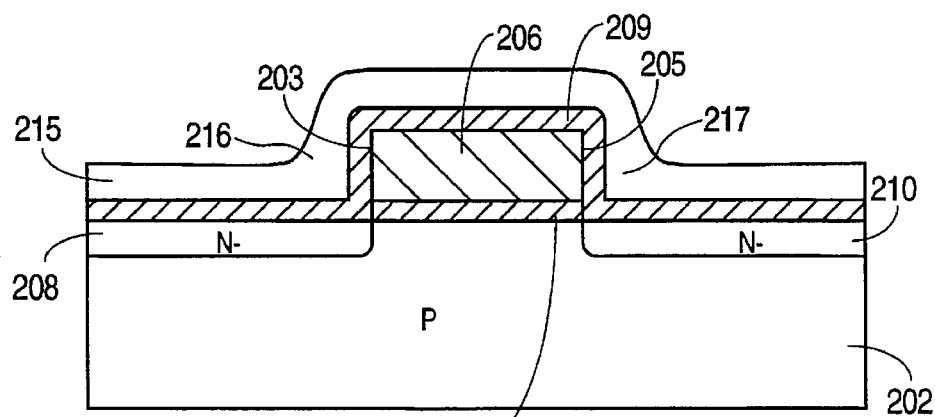

In FIG. 2D, an oxide layer 209 (such as SiO₂) is formed on the whole surface of the resultant structure. A nitride layer 215, such as silicon oxy-nitride or silicon containing nitride, is then deposited on the surface of the oxide layer 209. The nitride layer 215 and oxide layer 209 together provide a first symmetrical spacer 216 adjacent the first sidewall 203 and a second symmetrical spacer 217 adjacent the second sidewall 205 the first and second symmetrical spacers 216 and 217, respectively, having essentially identical sizes. The outer region of each of the first and second symmetrical spacers 216 and 217, respectively, is the boundary between each of the first and second symmetrical spacers 216 and 217, respectively, and a thinner portion of the oxide layer 209 which fails to provide an implant mask.

Figure 2E:
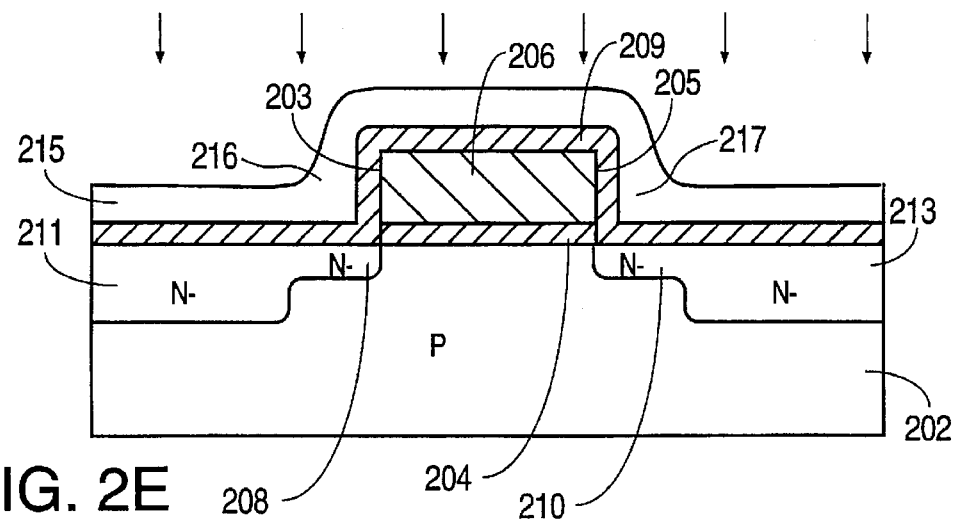

In FIG. 2E, a second dopant is implanted into the semiconductor substrate 202 and the polysilicon 206 using the polysilicon 206 and the first and second symmetrical spaces 216 and 217, respectively, as implant masks for the semiconductor substrate 202. Implanting the second dopant provides a moderately-lightly doped source region 211 and a moderately-lightly doped drain region 213 and provides a higher dopant concentration in the polysilicon 206. The structure is subjected to ion implantation of arsenic at a dose in the range of $1\times10^{15}$ to $2\times10^{15}$ atoms/cm² and an energy in the range of 2 to 80 kiloelectron-volts. As a result, the moderately-lightly doped source region 211, substantially aligned with the outer region of the first symmetrical spacer 216, and the moderately-lightly doped drain region 213, substantially aligned with the outer region of the second symmetrical spacer 217 are formed at and below the surface of substrate 202. Moderately-lightly doped source and drain regions 211 and 213, respectively, are doped N– with a dopant concentration in the range of about $1\times10^{18}$ to $5\times10^{20}$ atoms/cm³, and a junction depth in the range of 0.01 to 0.15 microns.

Figure 2F:
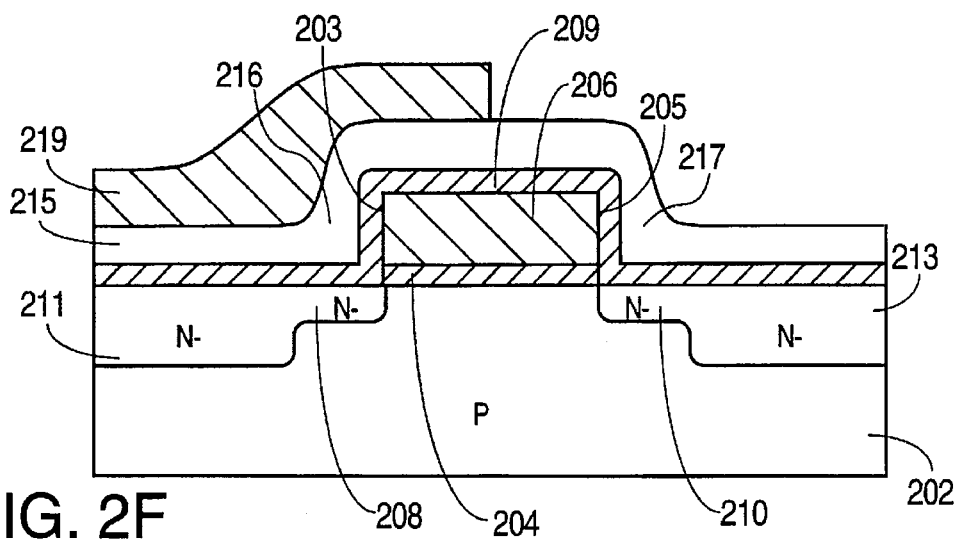

As shown in FIG. 2F, a masking film 219, such as a photoresist film, is formed on the nitride layer 215 above the first sidewall 203, the masking film 219 having an opening which exposes the nitride layer over a portion of the top surface of the polysilicon 206, the second sidewall 205 and the semiconductor substrate 202 outside of the second sidewall 205.

Figure 2G:
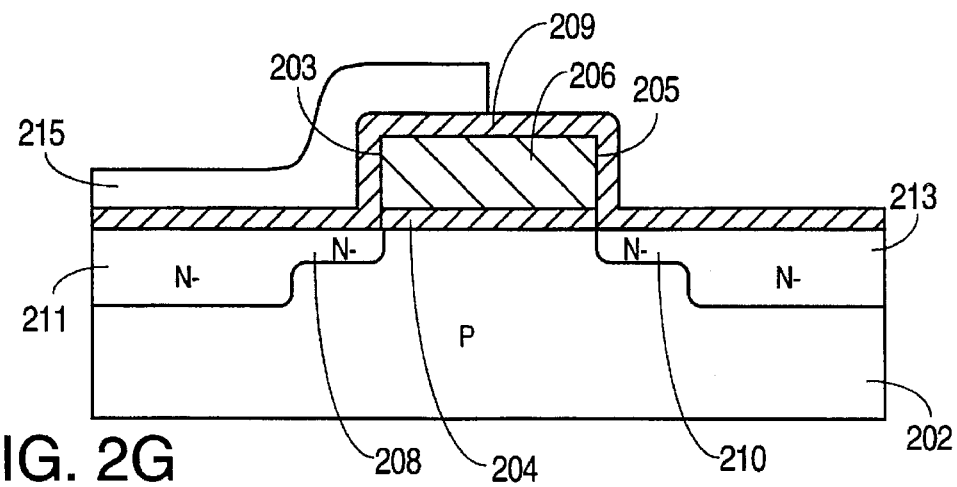

As shown in FIG. 2G, the nitride layer 215 exposed through the opening in the masking fill 219 is etched with a wet or dry etch that is highly selective of nitride to provide an opening in the nitride layer 215 which exposes the oxide layer 209 over a portion of the top of the polysilicon 206, adjacent the second sidewall 205 and over the semiconductor substrate 202 outside of the second sidewall 205 and wherein the nitride layer 215 covers the oxide layer 209 adjacent the first sidewall 203. The masking film 219 is then removed.

Figure 2H:
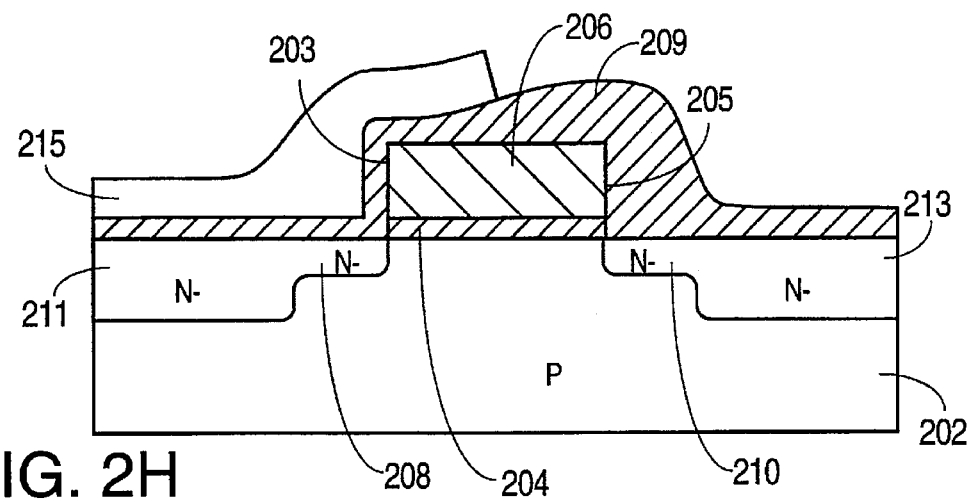

As shown, in FIG. 2H, the oxide layer 209 adjacent the first sidewall 203 is isolated by the nitride layer 215. Selective thermal oxidation is applied to the oxide layer 209 exposed through the opening in the nitride layer 215 wherein the oxide layer 209 adjacent the second sidewall 205 increases in size and the oxide layer 209 adjacent the first sidewall 203 remains substantially constant in size. For instance, the resultant structure is put into an H₂O or O₂ containing ambient and oxide is thermally grown at temperatures in the range of 800° to 1000° C. The oxide grows where there is no masking nitride layer 215. Furthermore, at the edge of the nitride layer 215, as seen in FIG. 2H, some oxidant diffuses laterally causing the oxide to grow under and lift the nitride layer 215 edge adjacent to the opening in the nitride layer 215.

In this thermal oxidation step, the oxidation growth rate of the polysilicon 206 is greater than to the oxidation growth rate of the semiconductor substrate 202. Doping the polysilicon 206 with an n-type dopant, as discussed in FIGS. 2B, 2C and 2E, enhances the polysilicon oxidation. Generally, the higher the dopant concentration, the more enhanced the oxidation growth rate. In the present invention, for instance, the polysilicon 206 is doped with n-type dopants after deposition during the implant of the first, fourth and second dopants into the substrate 202 (see FIGS. 2B, 2C and 2E).

Figure 2I:
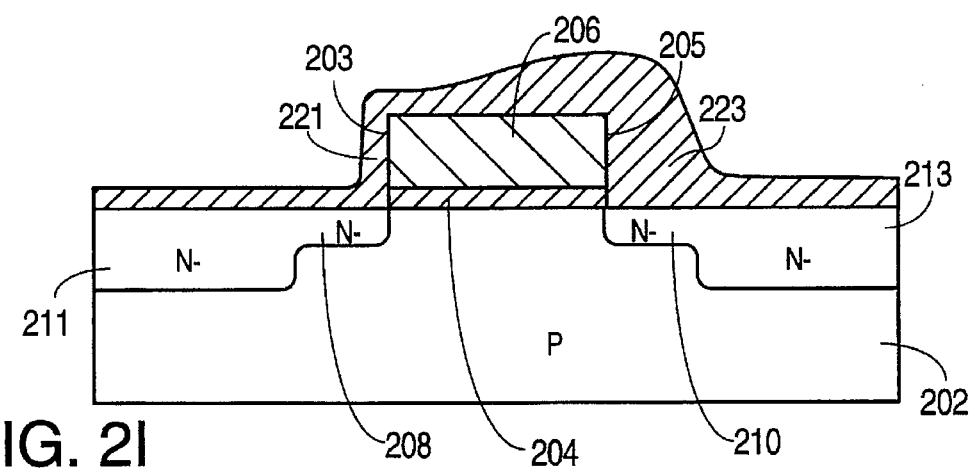

In FIG. 2I, the nitride layer 215 is removed with an etchant that is highly selective of nitride. Once the nitride layer 215 has been removed, the oxide layer 209 adjacent the first sidewall 203 provides a first non-symmetrical spacer 221 and the oxide layer 209 adjacent second sidewall 205 provides a second non-symmetrical spacer 223 wherein the first and second non-symmetrical spacers 221 and 223, respectively, have substantially different sizes.

Figure 2J:
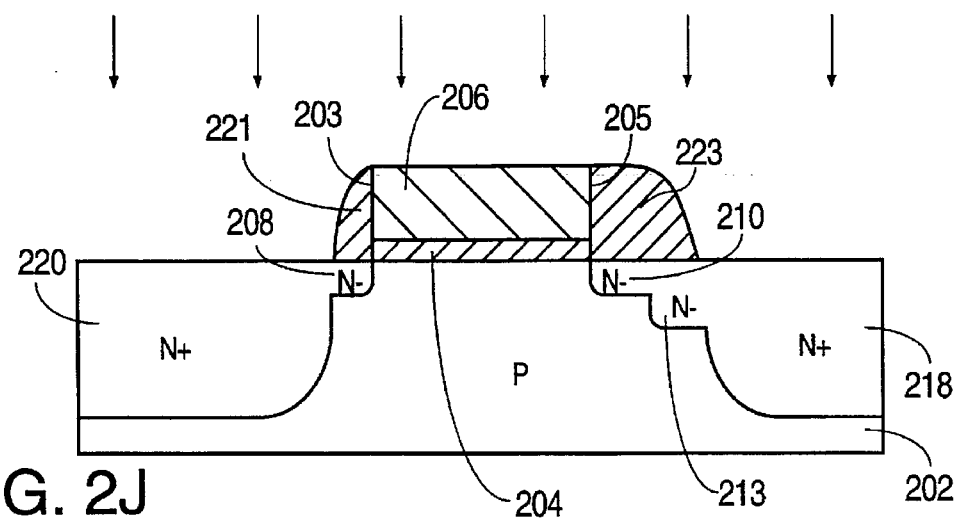

In FIG. 2J, the oxide layer 209 including the first and second non-symmetrical spacers 221 and 223, respectively, is partially etched back to provide a more uniform surface on the resultant structure. The first non-symmetrical spacer 221 may be removed entirely during the etching process (not shown) or a portion thereof may be left in place. In either case, at least a portion of the second non-symmetrical spacer 223 remains. A heavy dose of a third dopant is implanted into the semiconductor substrate 202 to provide a heavily doped drain region 218 adjacent to and outside the second non-symmetrical spacer 223 and a heavily doped source region 220 adjacent to and outside the first non-symmetrical spacer 221. The heavily doped drain region 218 and heavily doped source region 220 are formed in the semiconductor substrate 202 using the polysilicon 206, the first non-symmetrical spacer 221 and the second non-symmetrical spacer 223 as implant masks. The implant is performed using arsenic at a dosage of $1\times10^{15}$ to $5\times10^{15}$ atoms/cm² and an energy in the range of 2 to 80 kiloelectron-volts. As a result, the heavily doped drain region 218 and heavily doped source region 220 are formed at and below the surface of the semiconductor substrate 202 and are doped N+ with a dopant concentration in the range of $1\times10^{18}$ to $5\times10^{20}$ atoms/cm³, and a depth in the range of 0.02 to 0.3 microns. The heavily doped drain region 218, the moderately-lightly doped drain region 213 and the lightly doped drain region 210 together form a drain in the semiconductor substrate 202. The entire lightly doped source region 208 and moderately-lightly doped source region 211, each an N– region, are converted into an N+ region and effectively eliminated if the first non-symmetrical spacer 221 is removed before implanting the third dopant. However, if the first non-symmetrical spacer 221, or a portion thereof, is left in place during the implant of the third dopant, then the moderately-lightly doped source region 211 is effectively eliminated, however, a portion of the lightly doped source region 208 remains beneath the first non-symmetrical space 221 and the resistance of the source in the semiconductor substrate 202 is higher than it would be had the entire lightly doped source region 208 been converted.

The present invention is particularly well suited for forming N-channel MOSFETs because the combination of two N-type dopants, phosphorus and arsenic, provides a high drive current and high speed performance especially advantageous for microprocessors.

In both embodiments of the present invention, a rapid thermal anneal (RTA) is performed. For instance, after implanting the second dopant an RTA is performed and after implanting the third dopant an RTA is performed. The RTA is performed at a temperature range of 950° to 1050° C. for 10 to 60 seconds for N-type dopants.

Further processing steps in the fabrication of IGFETs typically include forming a thick oxide layer over the active regions, forming contact windows in the oxide layer above the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

Variations and modifications of the embodiments disclosed herein may be made based on the description set forth herein, without departing from the scope and spirit of the invention as set forth in the following claims.

What is claimed is:

1. A method for fabrication of a non-symmetrical IGFET, comprising the steps of:
    forming a gate insulator and a gate electrode over a semiconductor substrate, the gate electrode having a top surface and opposing first and second sidewalls;
    implanting a first dopant into the semiconductor substrate to provide a lightly doped drain region substantially aligned with the second sidewall;
    forming first and second symmetrical spacers adjacent the first and second sidewalls, respectively, after implanting the first dopant;
    implanting a second dopant into the semiconductor substrate after forming the first and second symmetrical spacers to provide a moderately-lightly doped source and drain region substantially aligned with the outer region of the first and second symmetrical spacers;
    forming first and second non-symmetrical spacers adjacent the first and second sidewalls, respectively, after implanting the second dopant; and then
    implanting a heavy dose of a third dopant into the semiconductor substrate to provide a heavily doped source region and a heavily doped drain region.

2. The method of claim 1 wherein the heavily doped source region is substantially aligned with the outside edge of the first non-symmetrical spacer and the heavily doped drain region is substantially aligned with the outside edge of the second non-symmetrical spacer.

3. The method of claim 1 further comprising removing the first non-symmetrical spacer before implanting the third dopant.

4. The method of claim 3 wherein implanting the third dopant provides a heavily doped source region substantially aligned with and outside of the first sidewall and a heavily doped drain region substantially aligned with the outside edge of the second non-symmetrical spacer.

5. The method of claim 1 wherein implanting the first dopant provides a lightly doped source region substantially aligned with the first sidewall and wherein implanting the third dopant converts at least a portion of the lightly doped source region and the moderately-lightly doped source region into the heavily doped source region.

6. The method of claim 1 further comprising implanting a fourth dopant into the semiconductor substrate before forming the first and second symmetrical spacers wherein the lightly doped drain region is further doped.

7. The method of claim 6 wherein implanting the first dopant and fourth dopant provides a lightly doped source region substantially aligned with the first sidewall and implanting the second dopant provides a moderately-lightly doped source region substantially aligned with the outer region of the first symmetrical spacer and wherein implanting the third dopant converts at least a portion of the lightly doped source region and the moderately-lightly doped source region into the heavily doped source region.

8. The method of claim 1 wherein the step of forming the first and second symmetrical spacers comprises:
    forming an oxide layer over the semiconductor substrate outside of the gate electrode, the top surface of the gate electrode and the first and second sidewalls of the gate electrode; and
    forming a nitride layer over the oxide layer wherein the nitride layer and oxide layer together extend a lateral distance from the first and second sidewalls to provide the first and second symmetrical spacers, respectively.

9. The method of claim 8 wherein the step of forming the first and second non-symmetrical spacers comprises:
    forming a masking film on the nitride layer above the first sidewall, the masking film having an opening which exposes the nitride layer above the second sidewall, a portion of the top of the gate electrode and the semiconductor substrate outside of the second sidewall;
    etching the portion of the nitride layer exposed through the opening in the masking film wherein an opening is provided in the nitride layer exposing the oxide layer adjacent the second sidewall and above a portion of the top of the gate electrode and the semiconductor substrate outside of the second sidewall and wherein the nitride layer covers the oxide layer adjacent the first sidewall;
    removing the masking film;
    thermally growing the oxide layer exposed through the opening in the nitride layer wherein the oxide layer adjacent the second sidewall increases in size and the oxide layer adjacent the first sidewall remains substantially constant in size, and wherein the oxide layer adjacent the second sidewall provides the second non-symmetrical spacer and the oxide layer adjacent the first sidewall provides the first non-symmetrical spacer; and
    removing the nitride layer.

10. The method of claim 9 wherein the gate electrode is a polysilicon and the semiconductor substrate is a single crystal silicon.

11. The method of claim 10 further comprising implanting the first dopant into the polysilicon, wherein the first dopant is an n-type dopant, to provide enhanced polysilicon oxidation wherein the oxidation growth rate of the second non-symmetrical spacer is greater than the oxidation growth rate of the oxide layer over the single crystal silicon adjacent to the second non-symmetrical spacer on the side opposite the polysilicon.

12. The method of claim 10 further comprising implanting a fourth dopant into the polysilicon, wherein the first dopant and the fourth dopant are n-type dopants, to provide enhanced polysilicon oxidation wherein the oxidation growth rate of the second non-symmetrical spacer is greater than the oxidation growth rate of the oxide layer over the single crystal silicon adjacent to the second non-symmetrical spacer on the side opposite the polysilicon.

13. The method of claim 1 wherein the first dopant is phosphorus.

14. The method of claim 1 wherein the second dopant is arsenic.

15. The method of claim 1 wherein the third dopant is arsenic.

16. The method of claim 6 wherein the fourth dopant is arsenic.

17. The method of claim 9 wherein thermally growing the oxide layer comprises thermal oxidation using an $O_2$ containing ambient.

18. The method of claim 9 wherein thermally growing the oxide layer comprises thermal oxidation using an $H_2O$ containing ambient.

19. The method of claim 1 further comprising:
performing a rapid thermal anneal after implanting the second dopant; and performing a rapid thermal anneal after implanting the third dopant.

20. The method of claim 9 wherein the masking film is a photoresist.

21. The method of claim 1 wherein the gate insulator is an oxide.

22. The method of claim 8 wherein the nitride layer is a silicon oxy-nitride.

23. The method of claim 8 wherein the nitride layer is a silicon containing nitride.

24. A method for fabrication of a non-symmetrical IGFET, comprising the steps of:
forming a gate insulator and a gate electrode over a semiconductor substrate, the gate electrode having a top surface and opposing first and second sidewalls;
implanting a first dopant and a second dopant into the semiconductor substrate to provide a lightly doped drain region substantially aligned with the second sidewall;
forming first and second symmetrical spacers adjacent the first and second sidewalls, respectively, after implanting the first and second dopants;
implanting a third dopant into the semiconductor substrate after forming the first and second symmetrical spacers to provide a moderately-lightly doped drain region substantially aligned with the outer region of the second symmetrical spacer;
forming first and second non-symmetrical spacers adjacent the first and second sidewalls, respectively, after implanting the third dopant; and then
implanting a heavy dose of a fourth dopant into the semiconductor substrate to provide a heavily doped source region and a heavily doped drain region.

25. The method of claim 24 wherein the heavily doped source region is substantially aligned with the outside edge of the first non-symmetrical spacer and the heavily doped drain region is substantially aligned with the outside edge of the second non-symmetrical spacer.

26. The method of claim 24 wherein implanting the first dopant and second dopant provides a lightly doped source region substantially aligned with the first sidewall and implanting the third dopant provides a moderately-lightly doped source region substantially aligned with the outer region of the first symmetrical spacer and wherein implanting the fourth dopant converts at least a portion of the lightly doped source region and the moderately-lightly doped source region into a portion of the heavily doped source region.

27. The method of claim 24 further comprising removing the first non-symmetrical spacer before implanting the fourth dopant.

28. The method of claim 27 wherein the heavily doped source region is substantially aligned with and outside of the first sidewall.

29. The method of claim 24 wherein the step of forming the first and second symmetrical spacers comprises:
forming an oxide layer over the semiconductor substrate outside of the gate electrode, the top surface of the gate electrode and the first and second sidewalls of the gate electrode; and
forming a nitride layer over the oxide layer wherein the nitride layer and oxide layer together extend a lateral distance from the first and second sidewalls to provide the first and second symmetrical spacers, respectively.

30. The method of claim 31 wherein the step of forming the first and second non-symmetrical spacers comprises:
forming a masking film on the nitride layer above the first sidewall, the masking film having an opening which exposes the nitride layer above the second sidewall, a portion of the top of the gate electrode and the semiconductor substrate outside of the second sidewall;
etching the portion of the nitride layer exposed through the opening in the masking film wherein an opening is provided in the nitride layer exposing the oxide layer adjacent the second sidewall and above a portion of the top of the gate electrode and the semiconductor substrate outside of the second sidewall and wherein the nitride layer covers the oxide layer adjacent the first sidewall;
removing the masking film;
thermally growing the oxide layer exposed through the opening in the nitride layer wherein the oxide layer adjacent the second sidewall increases in size and the oxide layer adjacent the first sidewall remains substantially constant in size, and wherein the oxide layer adjacent the second sidewall provides the second non-symmetrical spacer and the oxide layer adjacent the first sidewall provides the first non-symmetrical spacer; and
removing the nitride layer.

31. The method of claim 30 wherein the gate electrode is a polysilicon and the semiconductor substrate is a single crystal silicon.

32. The method of claim 31 further comprising implanting the first dopant, the second dopant and the third dopant into the polysilicon, wherein the first dopant, the second dopant and the third dopant are n-type dopants, to provide enhanced polysilicon oxidation wherein the oxidation growth rate of the second non-symmetrical spacer is greater than the oxidation growth rate of the oxide layer over the single crystal silicon adjacent to the second non-symmetrical spacer on the side opposite the polysilicon.

33. The method of claim 24 wherein the first dopant is phosphorus and the second dopant, the third dopant and the fourth dopant are arsenic.

34. A method for fabrication of a non-symmetrical IGFET comprising the sequence of steps of:
providing a single crystal silicon semiconductor substrate;

forming a gate oxide on the semiconductor substrate;

forming, on the gate oxide, a polysilicon electrode having a top surface and opposing first and second sidewalls;

implanting phosphorus and arsenic to provide a lightly doped drain region substantially aligned with the second sidewall and to provide a lightly doped polysilicon electrode;

forming an oxide layer over the semiconductor substrate outside of the polysilicon electrode, the top surface of the polysilicon electrode and the first and second sidewalls;

forming a nitride layer over the oxide layer wherein the nitride layer and oxide layer together extend a lateral distance from the first and second sidewalls to provide first and second symmetrical spacers, respectively;

implanting arsenic to provide a moderately-lightly doped drain region substantially aligned with the outer region of the second symmetrical spacer and to provide a higher dopant concentration in the polysilicon electrode;

forming a masking film on the nitride layer above the first sidewall, the masking film having an opening which exposes the nitride layer above the second sidewall, a portion of the top of the polysilicon electrode and the semiconductor substrate outside of the second sidewall;

etching the portion of the nitride layer exposed through the opening in the masking film wherein an opening is provided in the nitride layer exposing the oxide layer adjacent the second sidewall and above a portion of the top of the polysilicon electrode and the semiconductor substrate outside of the second sidewall and wherein the nitride layer covers the oxide layer adjacent the first sidewall;

removing the masking film;

thermally growing the oxide layer exposed through the opening in the nitride layer wherein the oxide layer adjacent the second sidewall increases in size and the oxide layer adjacent the first sidewall remains substantially constant size, and wherein the oxide layer adjacent the second sidewall provides a second non-symmetrical spacer and the oxide layer adjacent the first sidewall provides a first non-symmetrical spacer;

removing the nitride layer; and implanting arsenic to provide a heavily doped source region substantially aligned with the outside edge of the first non-symmetrical spacer and a heavily doped drain region substantially aligned with the outside edge of the second non-symmetrical spacer.

* * * * *